(12) United States Patent
Tan et al.

(10) Patent No.: US 6,828,831 B1
(45) Date of Patent: Dec. 7, 2004

(54) CIRCUIT FOR CONTROLLING FIELD EFFECT DEVICE TRANSCONDUCTANCE

(75) Inventors: Mehmet Ali Tan, Irvine, CA (US); Geert Adolf DeVeirman, Corona del Mar, CA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/452,089

(22) Filed: May 30, 2003

(51) Int. Cl.[7] .......................................... H02M 11/00
(52) U.S. Cl. ................................................ 327/103
(58) Field of Search ............................. 327/52–54, 56, 327/71, 75, 82, 89, 103, 538, 541, 543, 560–566; 330/4, 253, 277

(56) References Cited

U.S. PATENT DOCUMENTS

| | | | |
|---|---|---|---|
| 6,166,592 A | * 12/2000 | Walden | 327/562 |
| 6,292,034 B1 | * 9/2001 | Koifman et al. | 327/103 |
| 6,313,684 B1 | * 11/2001 | Bontempo | 327/295 |
| 6,483,383 B2 | * 11/2002 | Wu | 330/253 |
| 6,639,457 B1 | * 10/2003 | Lou | 327/560 |

* cited by examiner

Primary Examiner—My-Trang Nu Ton

(57) ABSTRACT

A transconductance control circuit includes a master device having first and second field effect devices coupled to respective first and second current sources, a reference device coupled to a third current source, and comparison circuitry. The comparison circuitry includes at least first, second and third inputs and at least one output, with the first input configured to receive a reference signal associated with the reference device, the second and third inputs coupled to respective terminals of the first and second field effect devices, and the output coupled to current control inputs of one or more of the current sources. The transconductance control circuit provides a feedback control arrangement in which, for example, the comparison circuitry output is utilized to adjust one or more of the current sources such that a difference signal $V_g$ between voltages at the respective terminals of the first and second field effect devices converges to a reference signal $V_R$. As a result, the transconductance $g_m$ of the first field effect device converges to the conductance of the reference device.

20 Claims, 2 Drawing Sheets

CIRCUIT FOR CONTROLLING FIELD EFFECT DEVICE TRANSCONDUCTANCE

FIELD OF THE INVENTION

The present invention relates generally to the field of electronic circuits, and more particularly to electronic circuits which include one or more metal-oxide-semiconductor (MOS) devices or other types of field effect devices.

BACKGROUND OF THE INVENTION

It is important in many electronic circuit applications to provide a mechanism for controlling the transconductance of one or more field effect devices. For example, in amplifiers, buffers, oscillators and other similar circuits, failure to provide proper control of the transconductance of certain MOS devices within the circuits can allow undesirable variations in one or more dimensionless parameters, such as gain, in the presence of variations attributable to factors such as process, temperature, voltage, etc.

Conventional techniques have been unable to provide an adequate solution to the problem of controlling MOS device transconductance, as will be described below.

One such conventional technique involves configuring the circuit so as to maintain the difference between the gate-to-source voltage $V_{GS}$ and the threshold voltage $V_T$ of the MOS device substantially equal to the voltage drop across a designated precision resistor. It is generally desirable, however, for the MOS device transconductance control to be implemented in a manner which is substantially independent of the threshold voltage $V_T$.

The issue of independence of $V_T$ is addressed in another conventional technique. In accordance with this technique, the circuit is configured such that relative changes in the gate-to-source voltage $V_{GS}$ of the MOS device and the voltage across the precision resistor track one another. This is achieved, for example, by adjusting the amount of the current flowing through the MOS device.

Nonetheless, these and other conventional techniques still suffer from a number of significant drawbacks. For example, the conventional techniques fail to implement the MOS transconductance value $g_m$ as the reciprocal of the precision resistor value R. In addition, certain conventional techniques require that particular assumptions be made regarding the relative values of R and $g_m$, such as an assumption that R is much less than $1/g_m$. Such assumptions are undesirable in that they can unduly limit the level of achievable precision, while also reducing circuit configuration flexibility. Furthermore, certain conventional techniques may require different transistor sizes in order to implement the MOS transconductance control, which further limits achievable precision and configuration flexibility.

As is apparent from the foregoing, a need exists for improved techniques for controlling the transconductance of a MOS device or other field effect device, which address one or more of the drawbacks of the conventional techniques described above.

SUMMARY OF THE INVENTION

The present invention provides a transconductance control circuit which in an illustrative embodiment is configured to control the transconductance of at least one MOS device such that it tracks the conductance of a resistor in the presence of circuit variations attributable to factors such as process, temperature or voltage.

In accordance with one aspect of the invention, a transconductance control circuit includes a master device having first and second field effect devices coupled to respective first and second current sources, a reference device coupled to a third current source, and comparison circuitry. The comparison circuitry includes at least first, second and third inputs and at least one output, with the first input configured to receive a reference signal associated with the reference device, the second and third inputs coupled to respective terminals of the first and second field effect devices, and the output coupled to current control inputs of one or more of the current sources.

In an illustrative embodiment, the transconductance control circuit provides a feedback control arrangement in which the comparison circuitry output is utilized to adjust one or more of the current sources such that a difference signal $V_g$ between voltages at the respective terminals of the first and second field effect devices converges to a reference signal $V_R$. As a result, the transconductance $g_m$ of the first device converges to the conductance of the reference device.

In accordance with another aspect of the invention, the first field effect device has a transconductance $g_m$ and the second field effect device has a transconductance $g_m'$ given approximately by $$g_m' = \left(1 + \frac{\alpha}{2}\right)g_m,$$

where $\alpha$ is selected such that $\alpha \ll 1$.

A transconductance control circuit in accordance with the invention may be implemented, for example, as a portion of an integrated circuit. As a more particular example, the transconductance control circuit may be implemented as a component of an amplifier, buffer, oscillator or other type of electronic circuit which is itself implemented as a portion of an integrated circuit.

Advantageously, the present invention provides a particularly efficient mechanism for controlling the transconductance of a MOS device or other field effect device in the presence of process, temperature or voltage variations, or other types of variations.

The transconductance control circuit in the above-noted illustrative embodiment provides significantly improved precision and flexibility relative to the conventional techniques previously described, in that the MOS transconductance $g_m$ is implemented so as to converge to the reciprocal of the resistor value R. Moreover, this transconductance control circuit does not require that any assumptions be made regarding relative resistance and transconductance values, nor does it require different size transistors.

DETAILED DESCRIPTION OF THE INVENTION

The present invention will be illustrated below in conjunction with exemplary embodiments of transconductance control circuits in which MOS device transconductance is controlled so as to track the conductance of a resistor. It should be understood, however, that the invention is not limited to use with the particular circuitry arrangements of the illustrative embodiments, and other embodiments may include, for example, different types and arrangements of controlled devices, reference devices, control circuitry, etc. For example, although illustrated in the context of MOS device transconductance control, the invention is more generally applicable to transconductance control for any type of field effect transistor (FET) or other field effect device.

Figure 1:
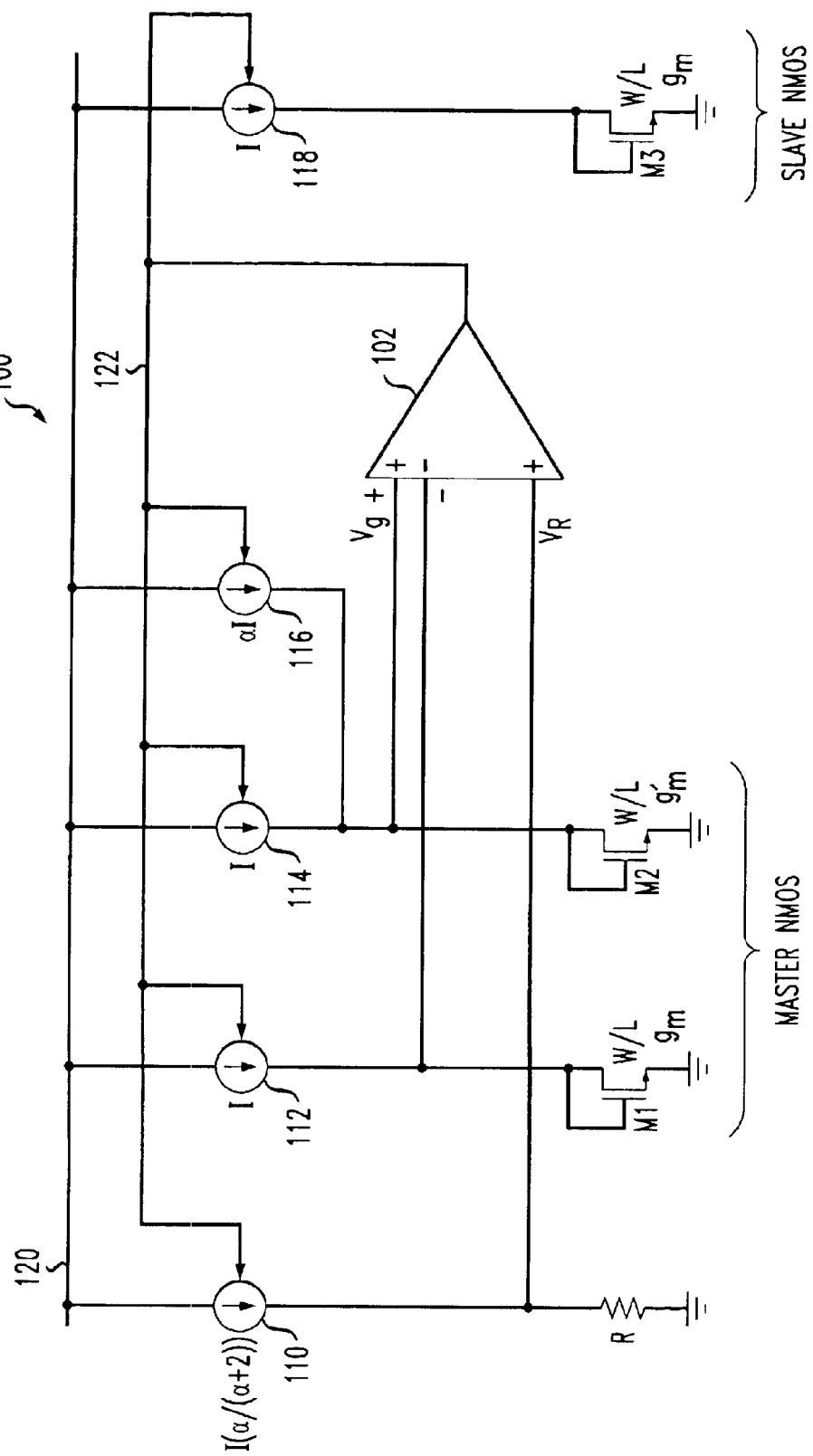
FIG. 1 is a schematic diagram of an N-type MOS (NMOS) implementation of an example current mode circuit for maintaining MOS device transconductance in accordance with an illustrative embodiment of the invention.

FIG. 1 shows a transconductance control circuit 100 configured in accordance with an illustrative embodiment of the invention. This embodiment is an example of an N-type MOS (NMOS) implementation of the invention, and includes NMOS devices M1, M2 and M3 as shown. The circuit 100 further includes comparison circuitry 102 and current sources 110, 112, 114, 116 and 118 arranged as shown.

The devices M1 and M2 collectively comprise an example of what is referred to herein as a master NMOS device, while the device M3 is an example of an associated slave NMOS device. Other arrangements of devices are possible. For example, a given master device may include more than two MOS devices or a single MOS device, or a slave device may include two or more MOS devices, in alternative embodiments.

The devices M1 and M2 of the master NMOS device are coupled to the current sources 112 and 114, respectively. Each of the devices M1 and M2 has a gate terminal, a source terminal and a drain terminal, with the gate terminal coupled to the drain terminal, the source terminal coupled to a ground potential of the circuit 100, and the associated current source 112 or 114 coupled between the drain terminal and an upper voltage potential associated with a VDD supply line 120 of the circuit 100. Ground potential in this embodiment represents an example of a lower voltage potential of the circuit 100, although other embodiments may use other types of lower voltage potentials, including a negative voltage supply.

The device M3 of the slave NMOS device is coupled to the current source 118. The device M3 has a gate terminal, a source terminal and a drain terminal, with the gate terminal coupled to the drain terminal, the source terminal coupled to ground potential of the circuit 100, and the current source 118 coupled between the drain terminal and the upper voltage potential of the circuit 100.

The devices M1, M2 and M3 have substantially the same channel width W and substantially the same channel length L in this embodiment.

The devices M1 and M3 each have a transconductance denoted herein as $g_m$, and the device M2 has a transconductance denoted herein as $g_m^t$.

The circuit 100 also includes a reference device which in this embodiment comprises a resistor RF The term "resistor" as used herein is intended to include a single-element precision resistor or any other type of resistor, including a transistor or other type of circuitry which is configured to operate as a resistor. The notation R is also used herein to refer to the particular resistance value associated with the resistor. The conductance of the resistor is therefore given by 1/R.

The resistor R is coupled to the current source 110. More specifically, the resistor R and the current source 10 are connected in series between the upper voltage potential of the circuit 100 and ground potential of the circuit 100.

The current source 116 is coupled between the upper voltage potential of the circuit 100 and a point in the circuit 100 between the device M2 and the current source 114.

Each of the current sources 112 and 114 has a current I associated therewith. The current source 118 is configured to mirror the current I associated with the current sources 112 and 114.

The current source 116 has a current I associated therewith, where a is a selectable operating parameter of the circuit 100, to be described in greater detail below.

The current associated with the current source 110 is also a function of the parameter α, and in this embodiment is given by:

$$I\left(\frac{\alpha}{(\alpha+2)}\right).$$

Each of the current sources 110, 112, 114, 116 and 118 also includes a current control input which is driven via signal line 122 by an output of the comparison circuitry 102.

Current mirroring, current control and other conventional techniques associated with the operation of the current sources 110, 112, 114, 116 and 118 are well-understood in the art and therefore not further described herein.

The comparison circuitry 102 in this embodiment comprises a multi-input comparator having at least first, second and third inputs and at least one output, although it is to be appreciated that the invention does not require this particular arrangement of comparison circuitry.

A first non-inverting input of the comparator is configured to receive a reference signal associated with the resistor R. The reference signal in this embodiment more specifically comprises a voltage $V_R$ across the resistor R.

Second and third inputs of the comparator are coupled to respective terminals of the devices M1 and M2. More specifically, a second non-inverting input of the comparator is coupled to a gate terminal of the device M2, and an inverting input of the comparator is coupled to a gate terminal of the device M1. As indicated previously, the gate terminals of the devices M1 and M2 are coupled to their respective drain terminals. The voltage difference between the gate terminals M2 and M1 is denoted in the figure as $V_g$.

As mentioned above, the output of the comparator is coupled via line 122 to current control inputs of each of the current sources 110, 112, 114, 116 and 118. In other embodiments, the comparison circuitry output may drive only a subset of the current source control inputs.

In operation, the transconductance control circuit 100 as described above controls the transconductance $g_m$ such that it tracks a conductance of the resistor R, thereby maintaining desired levels for dimensionless parameters such as gain in the presence of variations attributable to process, temperature, voltage, etc.

More specifically, the circuit 100 is configured to compare the transconductance $g_m$ of device M1 with the value of the resistor R, and to provide the necessary current adjustments such that $g_m$ is substantially equal to the resistor conductance 1/R.

The value of a utilized in circuit 100 is typically selected such that α<<1. This can be easily achieved by configuring the current sources 112, 114 and 116 such that the transconductance values $g_m$ and $g_m^t$ of the respective devices M1 and M2 are close to one another. By way of example, suitable values for a may be on the order of about 0.05 to 0.10. Other values of a can be used in alternative embodiments.

The transconductance $g_m^t$ of the device M2 can be expressed in terms of the transconductance $g_m$ of the device M1, approximately as $$g'_m = \left(1 + \frac{\alpha}{2}\right)g_m.$$

It can then be shown that the voltages $V_g$ and $V_R$ are given by:

$$V_g = \frac{\alpha}{(\alpha+2)} \frac{I}{g_m} \text{ and}$$

$$V_R = \frac{\alpha}{(\alpha+2)} IR.$$

The transconductance control circuit 100 configured in the manner shown in FIG. 1 provides a feedback control arrangement which adjusts the current sources such that $V_g$ will converge to $V_R$, and therefore $g_m$ will converge to the conductance 1/R of the resistor R. As indicated previously, the current I is mirrored and controls the slave device M3.

Figure 2:
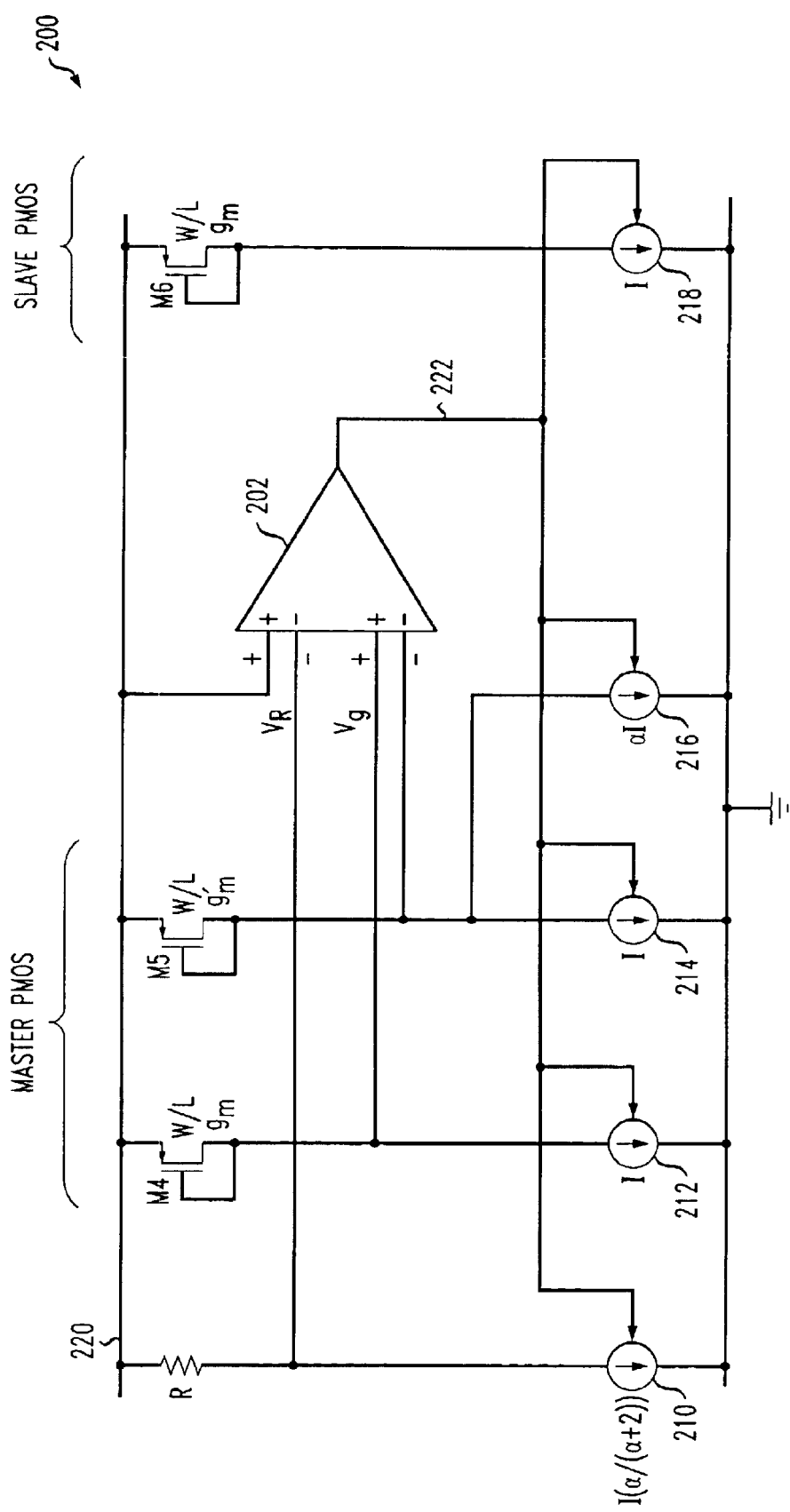
FIG. 2 is a schematic diagram showing a P-type (PMOS) implementation of the example current mode circuit of FIG. 1.

FIG. 2 shows a transconductance control circuit 200 representing a P-type MOS (PMOS) implementation of the FIG. 1 embodiment. The circuit 200 includes a master PMOS device comprising PMOS devices M4 and M5, a slave PMOS device comprising PMOS device M6, comparison circuitry 202, current sources 210, 212, 214, 216 and 218, and a reference device comprising resistor R.

The operation of the FIG. 2 PMOS implementation is analogous to that of the NMOS implementation previously described in conjunction with FIG. 1, as will be appreciated by those skilled in the art.

Advantageously, the transconductance control circuits of the illustrative embodiments of the invention each provide significantly improved precision and flexibility relative to the conventional techniques previously described. The illustrative embodiments implement the MOS transconductance value $g_m$ such that it converges to the reciprocal of the resistor value R. Moreover, these circuits do not require that any assumptions be made regarding relative resistance and transconductance values, nor do they require different size transistors.

The transconductance control circuits of FIGS. 1 and 2 may each be implemented, by way of example, as a component of an integrated circuit, and a given integrated circuit may include a plurality of such transconductance control circuits. As a more particular example, the transconductance control circuit may be implemented as a component of an amplifier, buffer, oscillator or other type of electronic circuit which is itself implemented as a portion of an integrated circuit.

Suitable values for circuit parameters such as channel widths W, channel lengths L, and resistance R will generally depend on factors such as the particular process and other variations that are present in a given implementation, and can be readily determined in a straightforward manner given the teachings contained herein.

It should again be emphasized that the exemplary transconductance control circuits described in conjunction with FIGS. 1 and 2 are intended to illustrate the operation of the invention, and therefore should not be construed as limiting the invention to any particular embodiment or group of embodiments. Furthermore, it will be apparent to those skilled in the art that the particular circuitry shown herein for purposes of illustrating the invention may be implemented in many different ways, and may include additional or alternative elements. For example, other types and arrangements of field effect devices, current sources, and comparison circuitry can be used. Also, the transconductance of one or more MOS devices may be made to track a parameter of a reference device comprising another circuit element or set of circuit elements, rather than to track the conductance of a resistor as in the illustrative embodiments.

These and numerous other alternative embodiments within the scope of the following claims will therefore be apparent to those skilled in the art.

What is claimed is:

1. A transconductance control circuit comprising:

a master device comprising first and second field effect devices, the first and second field effect devices coupled to respective first and second current sources;

a reference device coupled to a third current source; and comparison circuitry having at least first, second and third inputs and at least one output, the first input configured to receive a reference signal associated with the reference device, the second and third inputs coupled to respective terminals of the first and second field effect devices, the output being coupled to current control inputs of at least a subset of the first, second and third current sources;

the transconductance control circuit being operative to control a transconductance of at least one of the first and second field effect devices such that the transconductance tracks a conductance of the reference device.

2. The transconductance control circuit of claim 1 wherein each of the first and second field effect devices comprises a metal-oxide-semiconductor device.

3. The transconductance control circuit of claim 1 wherein the reference device comprises a resistor.

4. The transconductance control circuit of claim 1 wherein the comparison circuitry comprises a multi-input comparator.

5. The transconductance control circuit of claim 1 wherein the reference signal comprises a voltage across the reference device.

6. The transconductance control circuit of claim 1 wherein the terminals of the first and second field effect devices comprise gate terminals of the first and second field effect devices.

7. The transconductance control circuit of claim 1 wherein each of the first and second field effect devices comprises an N-type metal-oxide-semiconductor device having a gate terminal, a source terminal and a drain terminal, with the gate terminal coupled to the drain terminal, the source terminal coupled to a lower voltage potential of the circuit, and the associated first or second current source coupled between the drain terminal and an upper voltage potential of the circuit.

8. The transconductance control circuit of claim 1 wherein each of the first and second field effect devices comprises a P-type metal-oxide-semiconductor device having a gate terminal, a source terminal and a drain terminal, with the gate terminal coupled to the drain terminal, the source terminal coupled to an upper voltage potential of the circuit, and the associated first or second current source coupled between the drain terminal and a lower voltage potential of the circuit.

9. The transconductance control circuit of claim 1 wherein the first and second field effect devices have substantially the same channel width and substantially the same channel length.

10. The transconductance control circuit of claim 1 wherein the reference device and the third current source are coupled in series between first and second voltage potentials of the circuit.

11. The transconductance control circuit of claim 1 further comprising a fourth current source coupled between a voltage potential of the circuit and a point in the circuit between the second field effect device and the second current source, the output of the comparison circuitry being coupled to a current control input of the fourth current source.

12. The transconductance control circuit of claim 1 further comprising a slave device, the slave device comprising at least one additional field effect device coupled to an additional current source, the output of the comparison circuitry being coupled to a current control input of the additional current source, the additional current source being configured to mirror the current of at least one of the first, second and third current sources.

13. The transconductance control circuit of claim 12 wherein the additional field effect device comprises an N-type metal-oxide-semiconductor device having a gate terminal, a source terminal and a drain terminal, with the gate terminal coupled to the drain terminal, the source terminal coupled to a lower voltage potential of the circuit, and the additional current source coupled between the drain terminal and an upper voltage potential of the circuit.

14. The transconductance control circuit of claim 12 wherein the additional field effect device comprises a P-type metal-oxide-semiconductor device having a gate terminal, a source terminal and a drain terminal, with the gate terminal coupled to the drain terminal, the source terminal coupled to an upper voltage potential of the circuit, and the additional current source coupled between the drain terminal and a lower voltage potential of the circuit.

15. The transconductance control circuit of claim 1 wherein the comparison circuitry output is utilized to adjust one or more of the current sources such that a difference signal between voltages at the respective terminals of the first and second field effect devices converges to the reference signal, thereby causing the transconductance of the first field effect device to converge to a conductance of the reference device.

16. The transconductance control circuit of claim 1 wherein the first field effect device has a transconductance $g_m$ and the second field effect device has a transconductance $g_m^t$ given approximately by $$g_m' = \left(1 + \frac{\alpha}{2}\right) g_m,$$

where $\alpha$ is selected such that $\alpha \ll 1$.

17. The transconductance control circuit of claim 1 wherein the first field effect device has a transconductance $g_m$, a voltage difference signal between the terminals of the first and second field effect devices coupled to the respective second and third inputs of the comparison circuitry is given by:

$$V_g = \frac{\alpha}{(\alpha+2)} \frac{I}{g_m},$$

and the reference signal is given by:

$$V_R = \frac{\alpha}{(\alpha+2)} IR,$$

where $\alpha$ is selected such that $\alpha \ll 1$, I denotes a current associated with each of the first and second current sources, R denotes a resistance value of the reference device, and the circuit is configured such that in operation $V_g$ converges to $V_R$, and $g_m$ converges to $1/R$.

18. The transconductance control circuit of claim 1 wherein said transconductance control circuit is implemented as a component of an integrated circuit.

19. The transconductance control circuit of claim 1 wherein said transconductance control circuit is implemented as a component of one of an amplifier, a buffer and an oscillator.

20. An integrated circuit comprising at least one of an amplifier, a buffer and an oscillator, the integrated circuit further comprising at least one transconductance control circuit, the transconductance control circuit comprising:

a master device comprising first and second field effect devices, the first and second field effect devices coupled to respective first and second current sources;

a reference device coupled to a third current source; and comparison circuitry having at least first, second and third inputs and at least one output, the first input configured to receive a reference signal associated with the reference device, the second and third inputs coupled to respective terminals of the first and second field effect devices, the output being coupled to current control inputs of at least a subset of the first, second and third current sources;

the transconductance control circuit being operative to control a transconductance of at least one of the first and second field effect devices such that the transconductance tracks a conductance of the reference device.

* * * * *